United States Patent
Pelicia et al.

(10) Patent No.: US 10,658,927 B1
(45) Date of Patent: May 19, 2020

(54) BACK-BIASING REGULATION SYSTEM AND METHOD FOR INTEGRATED CIRCUITS

(71) Applicant: NXP USA, Inc., Austin, TX (US)

(72) Inventors: Marcos Mauricio Pelicia, Sao Paulo (BR); Ricardo Pureza Coimbra, Sao Paulo (BR); Luis Enrique Del Castillo, Sao Paulo (BR); Lei Tian, Shanghai (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/398,584

(22) Filed: Apr. 30, 2019

(30) Foreign Application Priority Data

Mar. 29, 2019 (CN) .......................... 2019 1 0249010

(51) Int. Cl.
*G05F 1/10* (2006.01)
*H02M 3/07* (2006.01)

(52) U.S. Cl.
CPC ........ *H02M 3/07* (2013.01); *H02M 2003/071* (2013.01)

(58) Field of Classification Search
CPC .......... H02M 3/158; H02M 3/07; G05F 1/10; G05F 1/56; G05F 1/575
See application file for complete search history.

(56) References Cited

U.S. PATENT DOCUMENTS

2014/0263972 A1*  9/2014  Chua ................... H01L 27/1443
                                                       250/208.2
2018/0048320 A1     2/2018  Zanetta

OTHER PUBLICATIONS

Blagojevic et al, "A Fast, Flexible, Positive and Negative Adaptive Body-Bias Generator in 28nm FDSOI", Symposium on VLSI Circuits Digest of Technical Papers, 2 pgs. (2016).
Coimbra et al., "Back Bias Regulator Circuit and Method Therefor", U.S. Appl. No. 15/892,463, filed Feb. 9, 2018, 23 pgs.

* cited by examiner

*Primary Examiner* — Sibin Chen

(57) ABSTRACT

Regulation systems and methods use a first regulator and a tracking second regulator. The first regulator receives a reference voltage and generates a first voltage output based upon the reference voltage, which is coupled as a back-bias voltage to a first load region within the integrated circuit. The first regulator also receives a sampled version of the first voltage output as feedback. A second regulator receives the first sampled voltage output and generates a second voltage output. The second regulator also receives a sampled version of the second voltage output as feedback. During operation, the second voltage output tracks (e.g., by a symmetry ratio) the first voltage output and is coupled as a back-bias voltage to a second load region within the integrated circuit. Further, switched-capacitor operation can be implemented, and clock frequency can be adjusted based upon the first sampled voltage output to reduce power consumption.

20 Claims, 6 Drawing Sheets

BACK-BIASING REGULATION SYSTEM AND METHOD FOR INTEGRATED CIRCUITS

RELATED APPLICATIONS

This application claims priority under 35 USC § 119 to China Patent Application No. 201910249010.1 filed on Mar. 29, 2019, and entitled "BACK-BIASING REGULATION SYSTEM AND METHOD FOR INTEGRATED CIRCUITS," which application is hereby incorporated by reference in its entirety.

TECHNICAL FIELD

This technical field relates to back-bias regulators for integrated circuits.

BACKGROUND

Many current electronic products rely upon low power or battery powered operation of one or more integrated circuits (ICs). These integrated circuits can be used in a wide variety of low-power/battery-operated applications including, for example, silicon-on-insulator (SOI) technology solutions, multi-core microcontrollers, or other low-power/battery-operated applications. Typically, some processing cores are high performance with high-power operation requirements, and other cores are lower performance with low-power operation requirements or very low-power operation requirements. SOI technologies provide dedicated device options for each case. High-performance cores are implemented with LVT (low threshold voltage) devices, and low-power cores are implemented using RVT (regular threshold voltage) devices.

For both LVT devices and RVT devices, back-biasing (BB) techniques are used to adjust the trade-off between performance and power for the RVT cores or the LVT cores. This trade-off is adjusted based upon whether a particular core is operating in a high-performance mode or in a low-power mode. RVT devices support a wide range of reverse back-biasing (RBB) voltages that allow power consumption to be significantly decreased at a given performance cost. LVT devices support a wide range of forward back-biasing (FBB) voltages that allow performance to be increased at a given power cost. In both cases, BB voltage levels may be set beyond the supply rails for the IC. As such, negative voltage charge pumps (NCPs) are employed to move BB voltage levels below the low-voltage supply rail voltage, and positive voltage charge pumps (PCPs) are employed to move BB voltage levels above the high-voltage supply rail voltage.

Prior BB solutions, however, suffer from various problems including the need for external capacitors. The need for external capacitors, for example, leads to an increase of system cost due to additional discrete components and package pins required to implement the external capacitors. Further, two different and dedicated circuit solutions are typically implemented, one to bias the RVT cores and another to bias the LVT cores. In addition, logic processing must typically be stopped during back-bias level transitions because different well voltages for the RVT cores and LVT cores are not sufficiently symmetrical during such transitions. As such, this stoppage in logic processing is required to support logic activity without the risk of timing violations. This stopping and restarting of logic processing, however, leads to increased power consumption and processing delays.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Figure 1:
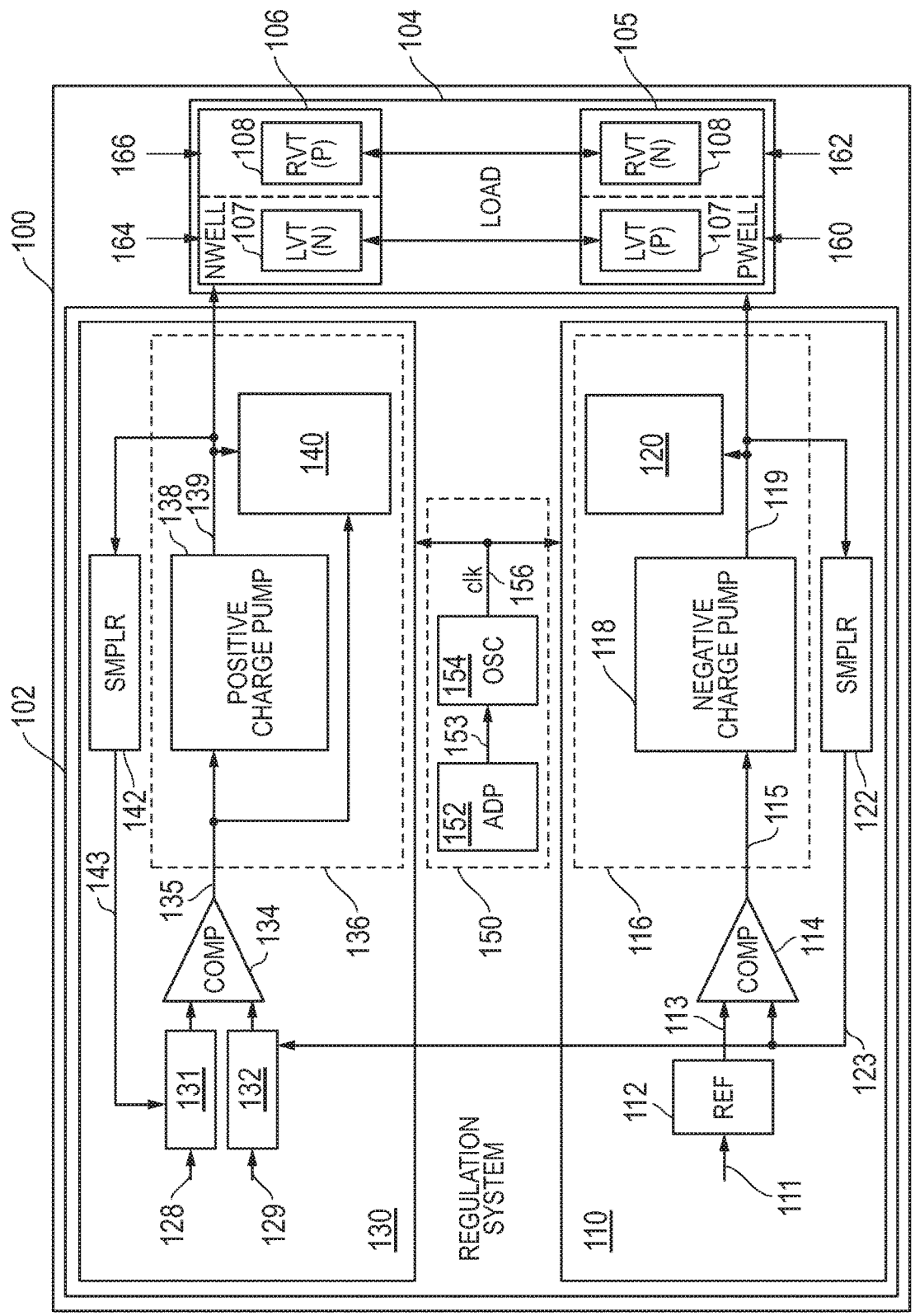
FIG. 1 is a block diagram of an example embodiment for an integrated circuit including a regulation system having a second regulator tracking a first regulator for the back biasing of wells within an integrated circuit.

Back-biasing regulation systems and related methods are disclosed for integrated circuits. A first regulator receives a reference voltage as an input and generates a first voltage output. The first voltage output is based upon the reference voltage and is coupled as a back-bias voltage to a first load region (e.g., P-well) within the integrated circuit. The first regulator also receives a sampled version of the first voltage output as feedback. A second regulator receives the first voltage output and generates a second voltage output. The second regulator also receives a sampled version of the second voltage output as feedback. During operation, the second voltage output tracks the first voltage output and is coupled as a back-bias voltage to a second load region (e.g., N-well) within the integrated circuit. The tracking can be controlled such that the second voltage output is related to the first voltage output by a symmetry ratio. Further, switched-capacitor operation can be implemented and controlled by a clock signal, and the clock signal can be implemented to have a programmable frequency. In addition, this variable frequency for the clock signal can be varied based upon the first sampled voltage output to reduce power consumption. A variety of additional or different features and variations can be implemented.

For one example embodiment, back-biasing circuits for LVT (low threshold voltage) cores and RVT (regular threshold voltage) cores are disclosed that do not require external capacitors or dedicated package pins. Further, a circuit architecture is employed that is configurable for different modes of operation through a programmable reference voltage. For example, in a first configuration LVT cores are biased for high-performance mode, and in a second configuration RVT cores are biased in low-power mode. In addition, well voltages are maintained symmetrical during back-bias level transitions to support uninterrupted logic processing.

For one example embodiment, a back-bias regulation system is provided that can be used, for example, with SOI technologies. SOI technologies include a silicon substrate formed on one or more layers of insulating material. Wells of different dopant types can be formed within the semiconductor substrate. For example, a P-well can be formed having p-type dopants, and an N-well can be formed having n-type dopants. Circuits, such as RVT cores and LVT cores, can be formed within the different wells of the semiconductor substrate. The back-bias regulation system includes two regulators, one to bias the P-well load region and one to bias the N-well load region. These regulators support a wide range and preferably all ranges of back-bias voltages applicable to RVT and LVT devices. Each regulator includes a comparator, a charge pump, and output discharge circuitry. A first regulator makes its output match a programmable input reference. A second regulator makes its output track the output level of the first regulator multiplied or adjusted by a programmable factor (e.g., symmetry ratio). This output tracking results in the different well voltages being kept symmetrical according to the programmed symmetry ratio even during level transitions. These level transitions include transitions after enable and disable of input reference changes as well as other level transitions. A programmable voltage reference generator generates the input reference voltage for the first regulator, and additional circuits sample the regulator outputs according to the symmetry ratio to provide a voltage input to the second regulator. Further, the symmetry ratio can be programmed to a desired value.

For one embodiment, the circuit elements for the voltage regulation system have an input clock signal and operate in a switched-capacitor mode. As such, total power consumption is approximately proportional to the frequency of the internal clock signal that drives the switched-capacitor operation. An oscillator generates the internal clock signal with a frequency that may be adjusted over a wide range of values. Control logic is also included to adjust automatically the internal clock frequency. For example, the internal clock frequency can be adjusted automatically based upon the voltage output from the first regulator to reduce power consumption. For example, the clock frequency can be adjusted to a minimum value required to maintain proper operation (e.g., to maintain output ripple within specified limits). The automatic adjustments allow minimum power consumption to be reached for a wide range of different load scenarios. Other variations can also be implemented.

The back-bias regulation system and methods are now described in more detail with respect to the drawings.

FIG. 1 is a block diagram of an example embodiment for an integrated circuit 100 including a regulation system 102. The regulation system 102 includes a first regulator 110 and a second regulator 130. The first regulator 110 drives P-well 105 within load 104 for the integrated circuit 100, and the second regulator 130 drives the N-well 106 within the load 104 for the integrated circuit 100. The first and second regulators 110/130 can be implemented with capacitors coupled to switches that are controlled by clock signal 156 to provide for switched-capacitor operation. Further, the integrated circuit 100 can include a semiconductor substrate, such as a semiconductor substrate formed on one or more insulating layers. The regulation system 102 and the load 104 can be formed in the semiconductor substrate. For further embodiments, one or more LVT cores 107 and RVT cores 108 can be formed at last on part within the P-well 105 and the N-well 106. Other circuits can also be formed as part of the regulation system 102, the load 104, or as part of the integrated circuit 100.

For embodiments where LVT cores 107 and RVT cores 108 are formed within P-well 105 and N-well 106, it is noted that these cores 107/108 will typically include circuits formed in both wells 105/106 as represented by the arrows between cores 107/108. For example, logic circuits for RVT cores 108 often have NMOS (n-channel metal oxide semiconductor) transistors formed within P-well 105 and PMOS (p-channel metal oxide semiconductor) transistors formed within N-well 106. Logic circuits for LVT cores 107 often have PMOS transistors formed within P-well 105 and NMOS transistors formed within the N-well 106. It is further noted that P-well 105 and N-well 106 will typically have different well regions that can be biased separately as indicated by the dashed lines within P-well 105 and N-well 106, respectively. For example, the first regulator 110 can be coupled to bias a first P-well region 160 for the PMOS transistors in the LVT cores 107 for a first mode of operation (e.g., high-performance mode), and the first regulator 110 can be coupled to bias a second P-well region 162 for the NMOS transistors in the RVT cores 108 for a second mode of operation (e.g., low-power mode). Similarly, the second regulator 130 can be coupled to bias a first N-well region 164 for the NMOS transistors in the LVT cores 107 for the first mode of operation (e.g., high-performance mode), and the second regulator 130 can be coupled to bias a second N-well region 166 for the PMOS transistors in the RVT cores 108 for the second mode of operation (e.g., low-power mode). For one embodiment, the well region being biased can be selected through the operation of one or more switches or multiplexers coupled between the regulators 110/130 and the regions within the wells 105/106. For example, the first regulator 110 can be selected to bias either region 160 or region 162 but not both at the same time, and the second regulator 130 can be selected to bias either region 164 or the region 166 but not both at the same time. Further, as described herein, the first and second regulators 110/130 can be configured for different operating ranges for different modes of operation using the control signals 111, 128, and 129. Other variations could also be implemented.

For one embodiment, the transient responses and power consumption for the regulators 110/130 are frequency dependent. The first regulator 110 uses a voltage reference generator 112 to provide an input reference voltage 113 to a comparator 114. The second regulator 130 uses a sampled voltage output 123 from the output of the first regulator 110 to generate an input reference to comparator 134 through ratio selector circuit 132. The ratio selector circuit 132 can be, for example, a programmable divider. This configuration causes the second regulator 130 to operate as a tracker regulator and makes symmetry possible. In operation, the tracker regulator configuration guarantees a proportional symmetry ratio between regulator outputs 119/139 not only at steady state (e.g., at the programmed levels) but also during output voltage transitions caused by adjustments to the reference voltage 113.

For switched-capacitor operation, the internal circuits for the regulators 110/130 are synchronized by a clock signal 156 generated by an oscillator system 150. The oscillator system 150 includes an oscillator 154 and an adaptive controller (ADP) 152. The frequency of the clock signal 156 is controlled by the adaptive controller 152. For one embodiment, the adaptive controller 152 increases or reduces the frequency of the clock signal 156 to reduce power consumption by adjusting the trade-off between consumption and output ripple magnitude according to load behavior. This switched-capacitor implementation with adaptive frequency control improves and preferably optimizes power consumption.

The first regulator 110 includes a comparator 114 with latched output 115, a reference generator 112, a sampler 122 that samples the voltage output 119, and an output stage 116. The output stage 116 includes a negative charge pump 118 and negative-tolerant current source used as a discharge circuit 120 to discharge the voltage output 119. The voltage reference generator 112 generates a reference voltage 113 for comparator 114. The voltage level for the reference voltage 113 can be programmed through the control signal 111 received by the voltage reference generator 112. The sampled voltage output 123 from sampler 122 provides a feedback signal that is also received by comparator 114. The comparator 114 compares the reference voltage 113 to the sampled voltage output 123 to generate the output 115 that is provided to negative charge pump 118 as a pump control signal. As indicated above, the first regulator 110 can be implemented using capacitors coupled to switches controlled by the clock signal 156 to provide switched-capacitor (SC) operation. This switched-capacitor operation and architecture facilitates reduced power consumption and low-power operation.

The second regulator 130 includes a comparator 134 with latched output 135, a sampler 142 that senses the voltage output 139, and an output stage 136. The output stage 136 includes a positive charge pump 138 and high-voltage-tolerant current source used as a discharge circuit 140 to discharge the voltage output 139. Two ratio selector circuits 131/132, which can be implemented as voltage dividers, are also provided to scale the outputs from the samplers 122/142 by programmable factors to allow proportional tracking voltage regulation. The programmable factors can be controlled through control signals 128/129. In operation, the programmable dividers 131/132 are used to help maintain a proportional symmetry ratio between the N-well back-bias voltage output 139 and the P-well back-bias voltage output 119. This symmetry ratio is also maintained during the turn-on/off transitions. The sampled voltage output 143 from sampler 142, which is passed through programmable divider 131, provides a feedback signal that is received by comparator 134. The comparator 134 compares the scaled output from divider 132 and the scaled output from divider 131 to generate the output 135 that is provided to positive charge pump 138 as a pump control signal. As indicated above, the second regulator 130 can be implemented using capacitors coupled to switches controlled by the clock signal 156 to provide switched-capacitor (SC) operation. This switched-capacitor operation and architecture facilitates reduced power consumption and low-power operation.

For the example embodiment of FIG. 1, the first regulator 110, which provides the P-well back-bias voltage output 119, operates as the primary regulator. The second regulator 130, which provides the N-well back-bias voltage output 139, operates as the tracker regulator. Alternatively, the N-well back-bias regulator 130 can be implemented as the primary regulator, and the P-well back-bias regulator 110 can be implemented as the tracker regulator. Other variations could also be implemented.

Figure 2:
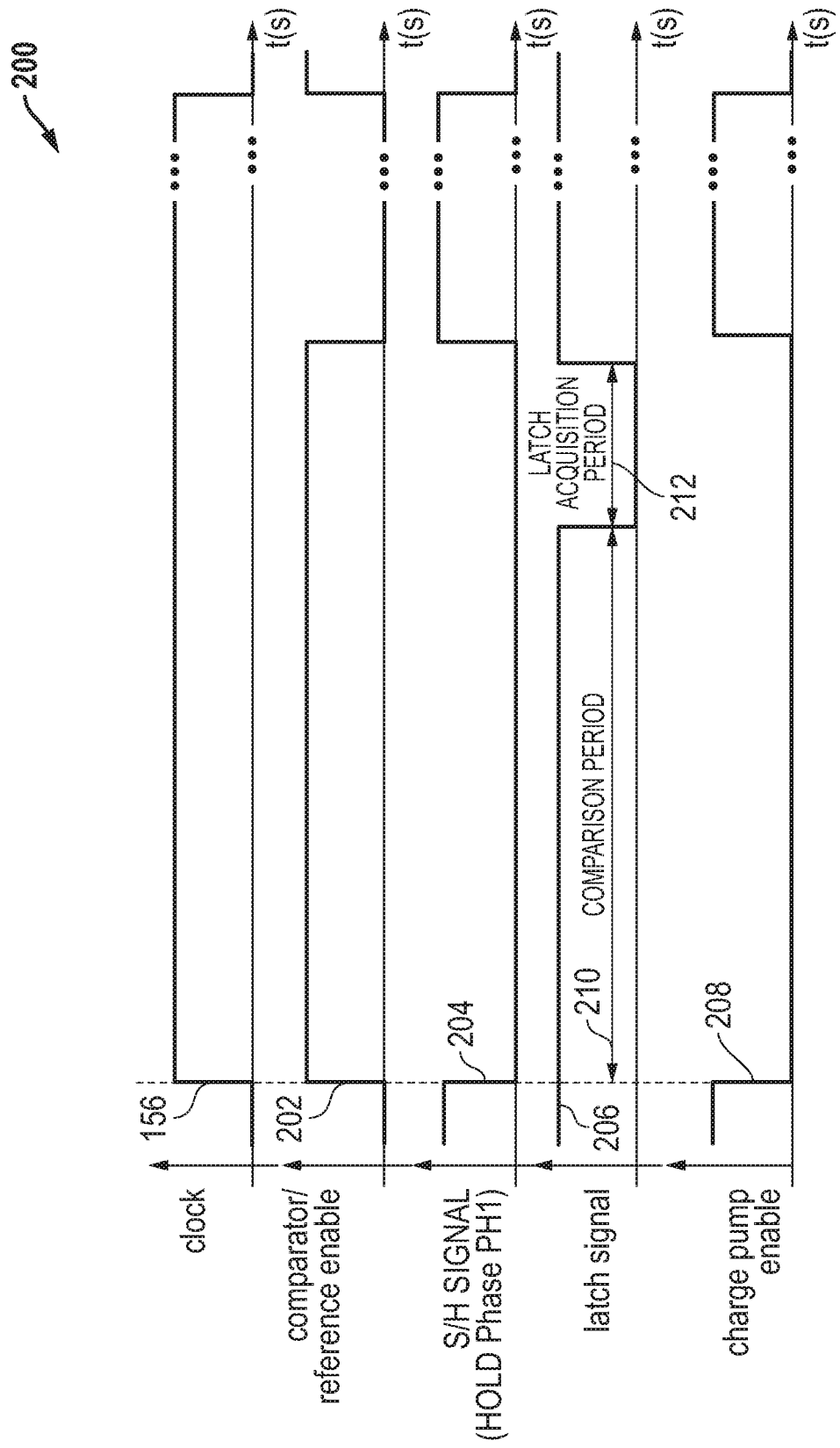
FIG. 2 provides an example embodiment for timing and control signals used in the operation of the first regulator of FIG. 1.

FIG. 2 is an example embodiment 200 for timing and control signals used in the operation of the first regulator 110. These signals include clock signal 156, an enable signal 202, a sample-and-hold (S/H) signal 204, a latch signal 206, and a charge pump enable signal 208. During operation of the first regulator 110 with respect to FIG. 1, a reference voltage 113 is generated by the voltage reference generator 112 for each half-cycle for clock signal 156. Along with this reference voltage 113, the comparator 114 also receives the sampled voltage output 123 obtained during the previous cycle by sampler 122, which is enabled/disabled by the S/H signal 206. The enable signal 202 can be provided to the reference generator 112 and the comparator 114 to enable operation of these circuits. Further, the circuits for the reference generator 112 and the sampler 122 can be implemented as switched capacitor circuits implemented with the same output capacitance to cancel out parasitic capacitance effects. The sampled voltage output 123 has the same magnitude as the voltage output 119, but with positive sign as the voltage output 119 is a negative back-bias voltage for the P-well 105. Based upon the enable signal 202, the comparator 114 is also enabled and the two signals 113/123 are compared. After a bias stabilization time represented by comparison period 210, the latch signal 206 is asserted (e.g., asserted when low logic level). The output state is then stored in a latch during latch acquisition period 212. The comparator 114 is then turned off by transition of the enable signal 202. This transition also moves the reference generator 112 and the sampler 122 to recharge/sampler phases. Immediately after latching, a charge pump clock for the negative charge pump 118 can be enabled by pump enable signal 208. Depending on the latched result, charge is then transferred to the output 119 if necessary.

During operation, the second regulator 130 operates as a tracker regulator and uses similar timing and control signals as shown for the first regulator 110 in FIG. 2. As shown in FIG. 1, the sampled voltage output 123 associated with voltage output 119 for the first regulator 110 serves as an input reference voltage for the second regulator 130. The sampled voltage output 143 for the voltage output 139 is compared to the sampled voltage output 123. Because the voltage output 139 for the back-bias of the N-well 106 and the voltage output 119 for the back-bias of the P-well 105 may have different output levels, the sampled voltage outputs 123/143 are equalized before being compared using programmable dividers 131/132. In addition, the samplers 122/142 can implemented with the same output capacitance to cancel out parasitic effects when the comparison is done. It is again noted that the timing for the operation of the sampler 142, comparator 134, and the charge pump 138 for the second regulator 130 is similar to the timing shown in FIG. 2 for the similar circuits in the first regulator 110.

Figure 3A:
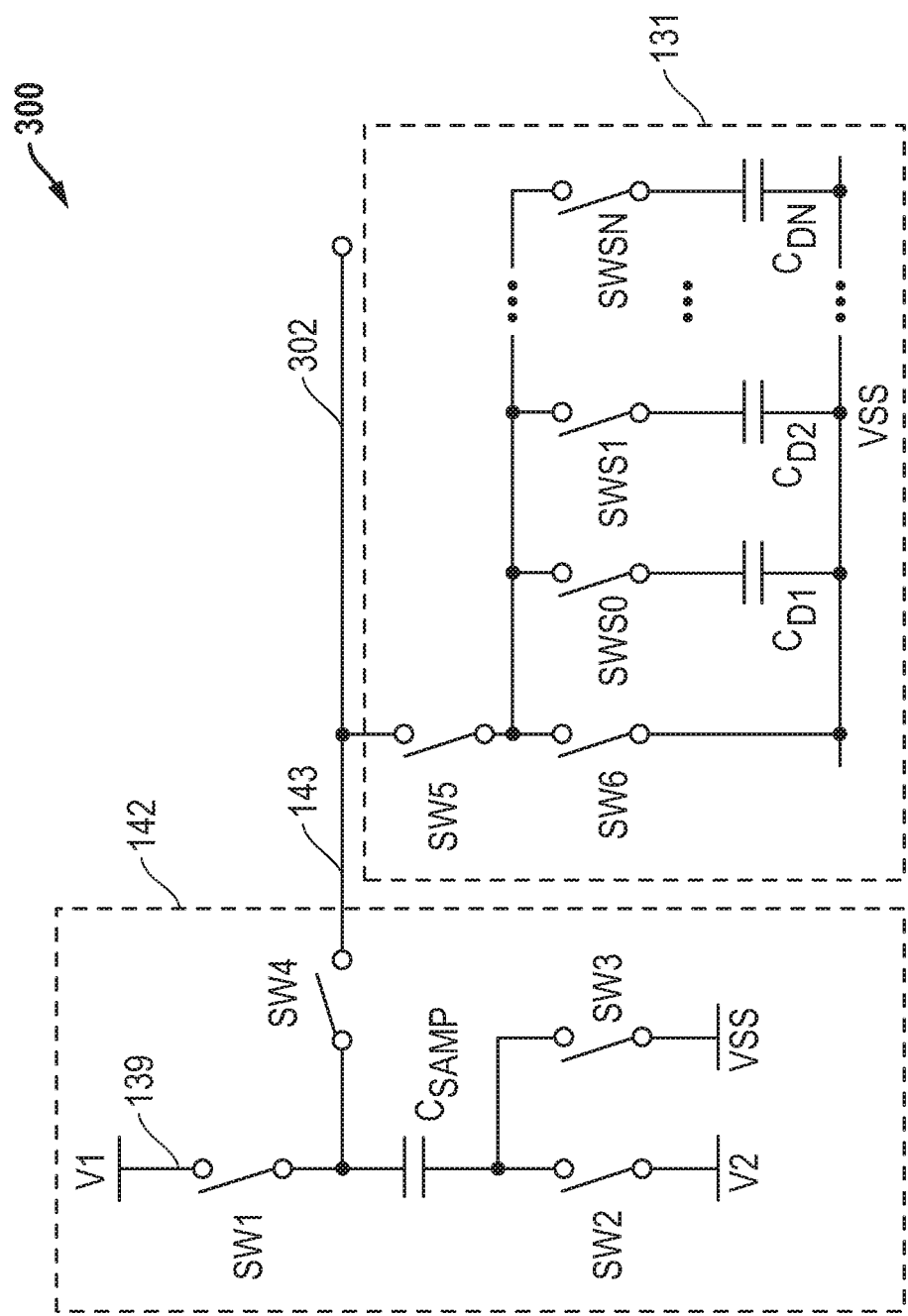
FIGS. 3A and 3B provide example embodiments of switched-capacitor circuits and timing signals for samplers and voltage dividers in FIG. 1.
Figure 3B:
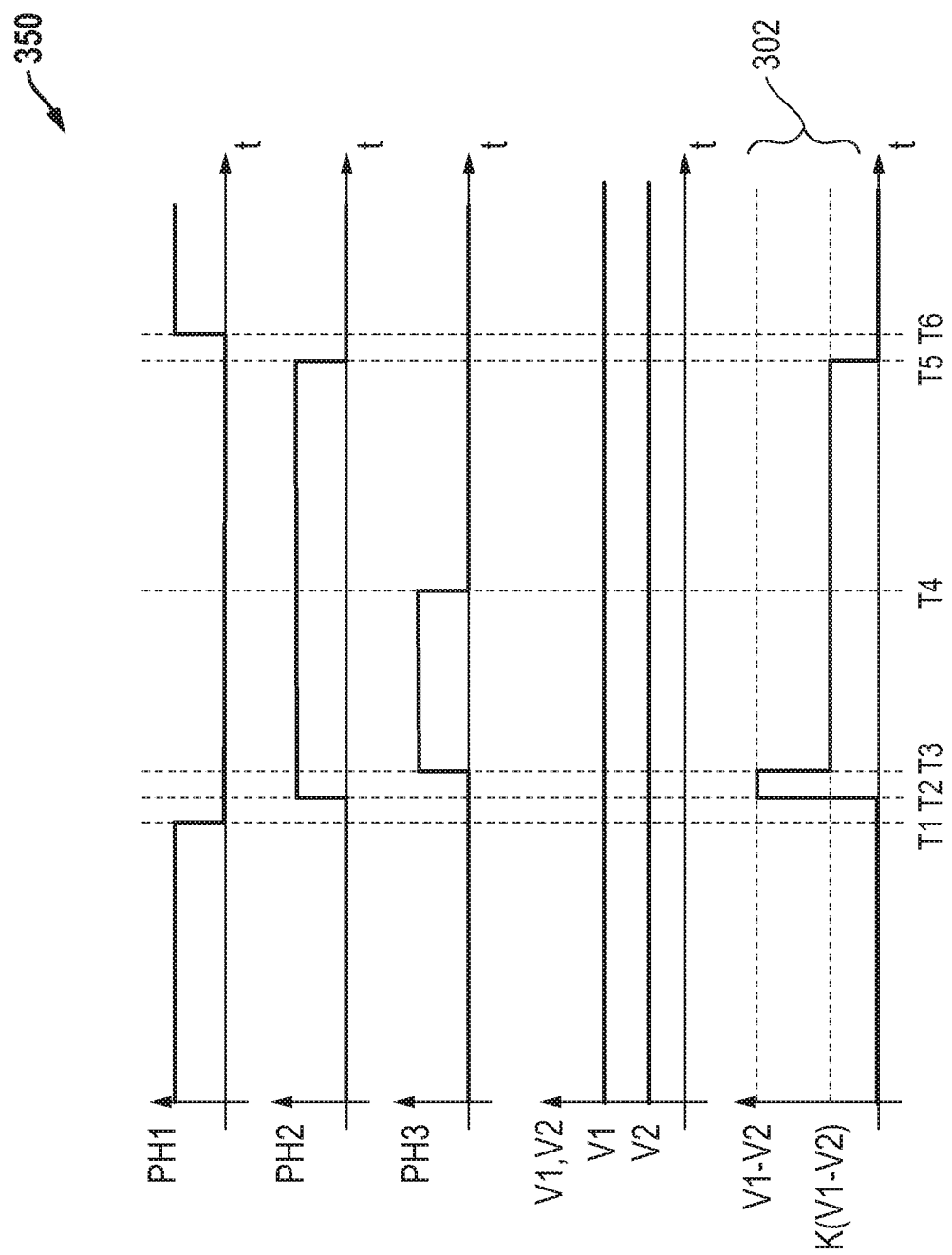

FIGS. 3A and 3B provide example embodiments of circuits and timing signals for sampler 142 and voltage divider 131. It is noted that sampler 122 can be implemented using similar circuits as shown for sampler 142. It is further noted that voltage divider 132 can be implemented using similar circuits to those shown for voltage divider 131.

As shown in embodiment 300 of FIG. 3A, the sampler 142 can be implemented with a capacitor CsAmp and switches SW1, SW2, and SW3. Switch SW1 is coupled to the voltage output 139 (e.g., indicated as V1), and Switch SW2 is coupled to an offset voltage V2. Switch SW3 is used to shift down the sampled voltage so that it becomes referred to Vss (e.g., ground) between sampling operations. The sampled voltage is the difference between voltage V1 and voltage V2 (e.g., Vsample=V1−V2). Switches SW2/SW1 are closed and switch SW3 is open during sampling. After sampling, switches SW2/SW1 open and switch SW3 closes to have this sampled voltage referred to Vss (e.g., a level-shift operation). This allows the following operations (e.g., voltage division and voltage comparison) to be done in respect to Vss. Switch SW4 is then used to transfer the sampled voltage output 143 to the voltage divider 131. The switch SW5 is used to enable voltage division provided by a capacitor array including discharge capacitors CD1, CD2 ... CDN. These capacitors are selected to be included or excluded from the divider operation through switches SWS0, SWS1 ... SWSN. Switch SW6 is used to reset the internal node for the voltage divider 131 to Vss between comparator cycles. During operation, the sampled and scaled-down voltage is provided as the output voltage on node 302, and node 302 is coupled to the input of comparator 134 shown in FIG. 1.

As shown in embodiment 350 of FIG. 3B, phase timing signals PH1, PH2, and PH3 can be used to control the switches in the sampler 142 and the voltage divider 131. The timing signals PH1/PH2/PH3 are based upon the clock signal 156 and provide non-overlapping characteristics to avoid signal loss during the process. Thus, for embodiments where the clock signal 156 is programmable or is otherwise adjusted, the timing signals PH1/PH2/PH3 will change along with the clock signal 156. For example embodiments shown in FIGS. 3A-B, timing signal PH1 controls switches SW1/SW2, which are "ON" when PH1 is a HIGH voltage level and "OFF" when PH1 is a LOW logic level. Timing signal PH2 controls switches SW3/SW4, which are "ON" when PH2 is a HIGH voltage level and "OFF" when PH2 is a LOW logic level. Timing signal PH2 also controls switch SW6, which is "OFF" when PH2 is a HIGH voltage level and "ON" when PH2 is a LOW logic level. Timing signal PH3 controls switch SW5, which is "ON" when PH3 is a HIGH voltage level and "OFF" when PH3 is a LOW logic level. Further, for the example embodiment 350 shown in FIG. 3B, it is noted that the time periods from time T1 to time T2, from time T2 to time T3, and from time T5 to time T6 represent one cycle for the clock signal 156.

During operation, when PH1 is HIGH, switches SW1 and SW2 are "ON" and the voltage output 139 is sampled (e.g. as voltage V1 minus bias voltage V2). At time T1, PH1 is set LOW turning "OFF" both switches SW1/SW2. At time T2, PH2 is set HIGH turning "ON" both switches SW3/SW4 and turning "OFF" switch SW6. At time T3, PH3 is set HIGH, and switch SW5 turns "ON" connecting selected discharge capacitors ($CD_1$, $CD_2$ ... $CD_N$) to the output node (VSMPL) as the output voltage on node 302. The discharge capacitors ($CD_1$, $CD_2$ ... $CD_N$) perform a capacitive division by a desired factor (K) reducing the output voltage (e.g., K(V1−V2)). As indicated above, voltage reduction is dependent of the amount of discharged capacitance selected through switches SWS0, SWS1 ... SWSN. These capacitor selection switches, for example, can be controlled by the control signal 128 shown in FIG. 1. At time T4, PH3 is set LOW and switch SW5 turns "OFF." The scaled-down output voltage is effectively stored on the output node 302. The output capacitance becomes equal to the output capacitor of the sampler 142. At time T5, switch SW6 turns "ON" and switches SW3/SW4 turn "OFF," finishing the hold phase. At time T6, the sampler returns to sampling cycle.

At the same time voltage sampling and division is being done, the comparators 114/134 are enabled to compare input signals. After comparison stabilization, the output state is latched and comparators 114/134 are turned off while samplers 122/142 are moved into sampling phase. Immediately after latching, pump clocks for the charge pumps 118/138 can be enabled, depending on the latched results, to transfer charge to the voltage outputs 119/139.

During disable states for the integrated circuit 100, the circuits within the first regulator 110 are turned "OFF" except for the discharge circuit 120 which is turned "ON." The P-well 105 then starts to be discharged with a constant current. The second regulator 130 is kept "ON," controlling the discharge on the N-well 106 to maintain the N-well and P-well voltage outputs 119/139 proportional to each other. The discharge circuit 120 sends a handshake signal when the discharge concludes and the disabling event is finished. The discharge circuit 140 is used to discharge the voltage output 139.

For one embodiment, power consumption control is also provided. An amount of charge (Qi) moved to the output capacitance (C) on each charge pump transfer cycle causes a voltage variation (ΔV) as shown in Equation 1 below. The well voltages are discharged by leakage current ($I_{lkg}$), and the time to discharge ($T_{dschg}$) the stored voltage in the previous charge transfer is shown in Equation 2 below.

$$\Delta V = \frac{Q_i}{C} \qquad \text{(EQUATION 1)}$$

$$T_{dchg} = \frac{\Delta V \cdot C}{I_{lkg}} \qquad \text{(EQUATION 2)}$$

Figure 4:
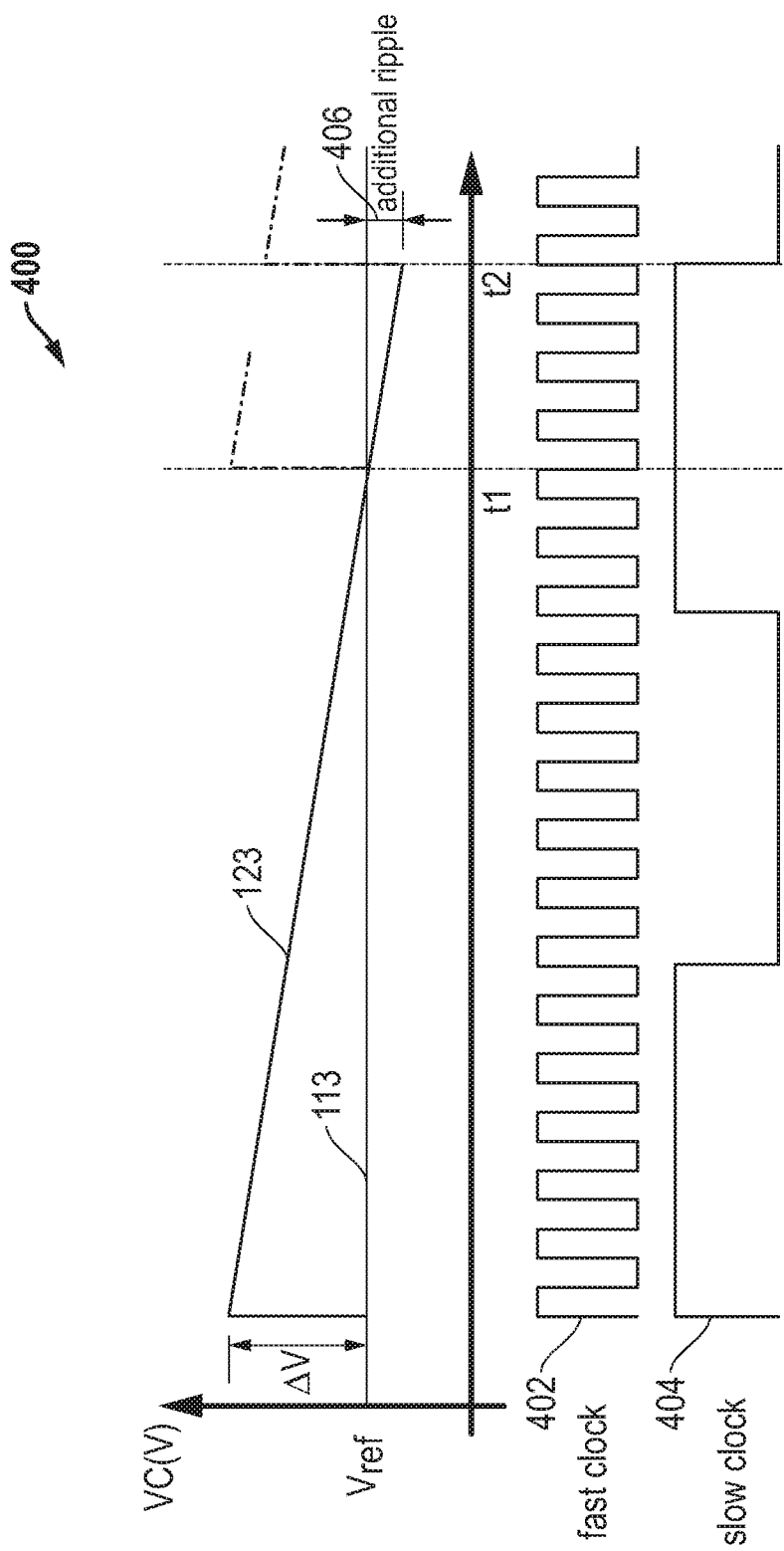
FIG. 4 provides an example embodiment for using a comparison between the reference voltage and the sampled voltage output for the first regulator of FIG. 1 in order to control a clock frequency for switched-capacitor operation.

FIG. 4 provides an example embodiment 400 for using a comparison between the reference voltage (Vref) 113 and the sampled voltage output 123 to control a clock frequency for switched-capacitor operation. This comparison is performed on each clock toggle as part of the switched regulation control loop. For example, the comparator 114 can be controlled by the clock signal 156, and the latched output 115 from comparator 114 represents the difference between the sampled voltage output 123 and the reference voltage (Vref) 113. As described herein, the circuit consumption for the switch-capacitor embodiments is clock frequency dependent. Once the sampled voltage output 123 drifts below the reference voltage 113, it can take up to one half-clock cycle for the system to counter-react and trigger a charge pump event. For example, with a fast clock 402, this event where the sampled output 123 becomes less than the reference voltage (Vref) 113 is detected at an earlier time (t1). For a slow clock 404, this event is detected at a later time (t2) where the sampled voltage output 123 has already fallen below the reference voltage 113. As such, the slow clock 404 leads to an output voltage undershoot approximatively proportional to the clock period. Therefore, to minimize power consumption, clock frequency is preferably kept around the minimum value possible for which voltage undershoot still falls within the tolerated limits. For example, if the additional ripple 406 is allowable, then the slow clock 404 is acceptable and can be used to reduce power consumption as compared to high frequency clocks such as fast clock 402.

The main regulator activity can be used to adjust clock frequency. For example, the latched output 115 from comparator 114 for the first regulator 110 can be provided to the adaptive controller 152 in FIG. 1. The adaptive controller 152 can then provide a control signal 153 to the oscillator 154 to vary the frequency of the clock signal 156. A variety of frequency control algorithms can be used and can be selected based upon technology implementations, load characteristics, or other factors. One example of algorithm is to increase (e.g., double) or decrease (e.g., halve) the clock frequency whenever a new comparison result does or does not trigger a charge pump event. For example, where charge pump event is triggered by the sampled voltage output 123 dropping below the reference voltage 113, the clock rate can be increased (e.g., doubled). Where the charge pump event is not triggered by the sampled voltage output 123 staying above the reference voltage 113, then the clock rate can be decreased (e.g. halved). These adjustments can continue during operation of the regulation system. It is further noted that a fixed clock rate can also be used for some embodiments. For example, in cases where a fast reaction is always required with no restriction to power consumption, the regulation system 102 can be configured to operate at a fixed operation frequency, such as a maximum operation frequency. Other variations and algorithms can also be implemented.

Figure 5:
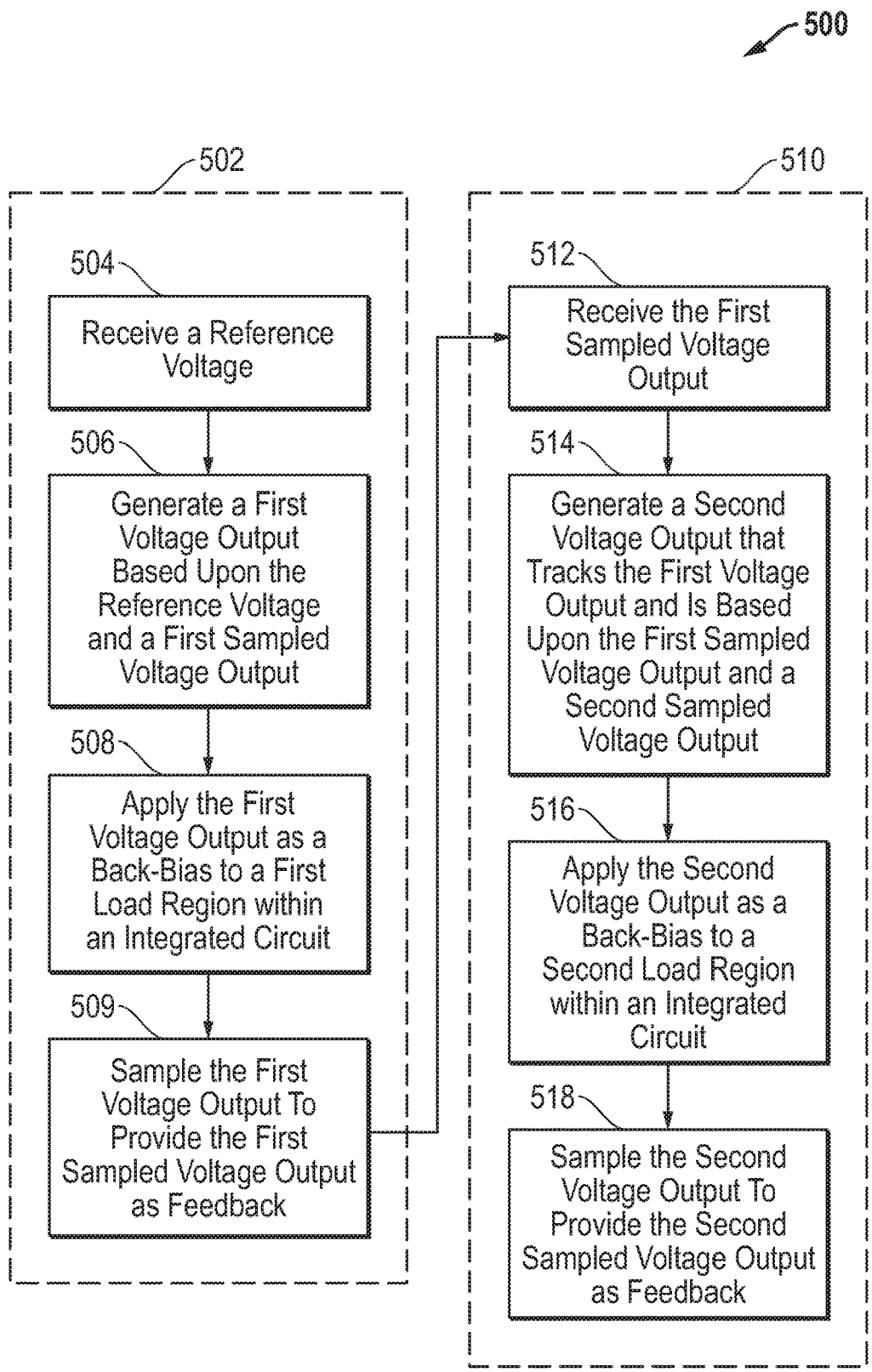
FIG. 5 is a process diagram of an example embodiment to provide back biasing for different wells for an integrated circuit using a second regulator that tracks a first regulator.

FIG. 5 is a process diagram of an example embodiment 500 to provide back biasing for different wells for an integrated circuit using a second regulator that tracks a first regulator. The blocks within dashed line 502 represent operations performed by the first regulator 110 in FIG. 1, and the blocks with dashed line 510 represent operations performed by the second regulator 130 in FIG. 1. Looking first to block 504, a reference voltage 113 is received by the first regulator 110. In block 506, a first voltage output 119 is generated by the first regulator 110 based upon the reference voltage 113. In block 508, the first voltage output is applied by the first regulator 110 as a back-bias voltage to a first load region (e.g., P-well or N-well) 105 within the integrated circuit 100. In block 512, the first voltage output 119 is received by the second regulator 130, for example, through a sampler 122. In block 514, a second voltage output 139 is generated by the second regulator 130, and this second voltage output 139 tracks the first voltage output 119. In block 516, the second voltage output 139 is applied by the second regulator 130 as a back-bias voltage to a second load region (e.g., N-well or P-well) within the integrated circuit As described herein, a variety of embodiments can be implemented and different features and variations can be implemented, as desired.

For one embodiment, a voltage regulation system for an integrated circuit is disclosed including a first regulator, a first sampler for the first regulator, a second regulator, and a second sampler for the second regulator. The first regulator has a reference voltage as an input and has a first voltage output coupled as a back-bias voltage to a first load region within the integrated circuit, and the first voltage output is based upon the reference voltage and a first sampled voltage output. The first sampler is coupled to receive the first voltage output and to provide the first sampled voltage output as feedback for the first regulator. The second regulator has the first sampled voltage output as an input and has a second voltage output coupled as a back-bias voltage to a second load region within the integrated circuit, and the second voltage output tracks the first voltage output and is based upon the first sampled voltage output and a second sampled voltage output. The second sampler is coupled to receive the second voltage output and to provide the second sampled voltage output as feedback for the second regulator.

In additional embodiments, the first sampler and the second sampler include capacitors and switches controlled by a clock signal to provide switched-capacitor operation. In further embodiments, the clock signal has a variable frequency based upon the first sampled voltage output to reduce power consumption. In still further embodiments, the variable frequency is increased when the first sampled voltage output drops below the reference voltage and is decreased when the first sampled voltage output rises above the reference voltage.

In additional embodiments, the integrated circuit includes a semiconductor substrate; the first load region includes a well of a first dopant type within the semiconductor substrate; and the second load region includes a well of a second dopant type within the semiconductor substrate.

In additional embodiments, the second regulator is coupled to receive the first sampled voltage output through a divider, and the divider causes the second voltage output to track the first voltage output by a symmetry ratio. In further embodiments, the divider is programmable. In still further embodiments, the divider includes capacitors and switches controlled by a clock signal to provide switched-capacitor operation, and the clock signal has a variable frequency based upon the first sampled voltage output to reduce power consumption.

In additional embodiments, the first regulator includes a first comparator having the reference voltage and the first sampled voltage output as inputs and having a first output coupled to a first charge pump. In addition, the second regulator includes a second comparator having the first sampled voltage output and the second sampled voltage output as inputs and having a second output coupled to a second charge pump.

For one embodiment, an integrated circuit is disclosed including a first load region within a semiconductor substrate having a first dopant type, a second load region within the semiconductor substrate having a second dopant type, and a voltage regulation system. The voltage regulation system includes a first regulator, a first sampler for the first regulator, a second regulator, and a second sampler for the second regulator. The first regulator has a reference voltage as an input and has a first voltage output coupled as a back-bias voltage to a first load region within the integrated circuit, and the first voltage output is based upon the reference voltage and a first sampled voltage output. The first sampler is coupled to receive the first voltage output and to provide the first sampled voltage output as feedback for the first regulator. The second regulator has the first sampled voltage output as an input and has a second voltage output coupled as a back-bias voltage to a second load region within the integrated circuit, and the second voltage output tracks the first voltage output and is based upon the first sampled voltage output and a second sampled voltage output. The second sampler is coupled to receive the second voltage output and to provide the second sampled voltage output as feedback for the second regulator.

In additional embodiments, the first sampler and the second sampler include capacitors and switches controlled by a clock signal to provide switched-capacitor operation. In further embodiments, the clock signal has a variable frequency based upon the first sampled voltage output to reduce power consumption.

In additional embodiments, the second regulator includes a divider coupled to receive the first voltage output, and the divider causes the second voltage output to track the first voltage output by a symmetry ratio. In further embodiments, the divider is programmable; the divider includes capacitors and switches controlled by a clock signal to provide switched-capacitor operation; and the clock signal has a variable frequency based upon the first sampled voltage output to reduce power consumption.

For one embodiment, a method is disclosed for a first regulator and a second tracking regulator within an integrated circuit. With the first regulator the method includes receiving a reference voltage as an input, generating a first voltage output based upon the reference voltage and a first sampled voltage output, applying the first voltage output as a back-bias voltage to a first load region within the integrated circuit, and sampling the first voltage output to provide the first sampled voltage output as feedback for the first regulator. With the second regulator the method includes receiving the first sampled voltage output as an input, generating a second voltage output that tracks the first voltage output and that is based upon the first sampled voltage output and a second sampled voltage output, applying the second voltage output as a back-bias voltage to a second load region within the integrated circuit, and sampling the second voltage output to provide the second sampled voltage output as feedback for the second regulator.

In additional embodiments, the sampling includes controlling switches coupled to capacitors with a clock signal to provide switched-capacitor operation. In further embodiments, the method also includes varying a frequency for the clock signal based upon the first sampled voltage output to reduce power consumption. In still further embodiments, the varying includes increasing the frequency when the first sampled voltage output drops below the reference voltage and decreasing the frequency when the first sampled voltage output rises above the reference voltage.

In additional embodiments, the method also includes, with the second regulator, adjusting the first sampled voltage output by a symmetry ratio as part of the generating of the second voltage output. In further embodiments, the adjusting includes controlling switches coupled to capacitors with a clock signal to provide switched-capacitor operation, and the method also includes varying a frequency for the clock signal based upon the first sampled voltage output to reduce power consumption.

It is further noted that the functional blocks, components, systems, devices, or circuitry described herein can be implemented using hardware, software, or a combination of hardware and software. For example, the disclosed embodiments can be implemented using one or more integrated circuits that are programmed to perform the functions, tasks, methods, actions, or other operational features described herein for the disclosed embodiments. The one or more integrated circuits can include, for example, one or more processors or configurable logic devices (CLDs) or a combination thereof. The one or more processors can be, for example, one or more central processing units (CPUs), controllers, microcontrollers, microprocessors, hardware accelerators, ASICs (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the integrated circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The integrated circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A voltage regulation system for an integrated circuit, comprising:
   a first regulator having a reference voltage as an input and having a first voltage output coupled as a back-bias voltage to a first load region within the integrated circuit, the first voltage output being based upon the reference voltage and a first sampled voltage output;
   a first sampler for the first regulator coupled to receive the first voltage output and to provide the first sampled voltage output as feedback for the first regulator;
   a second regulator having the first sampled voltage output as an input and having a second voltage output coupled as a back-bias voltage to a second load region within the integrated circuit, the second voltage output tracking the first voltage output and being based upon the first sampled voltage output and a second sampled voltage output; and
   a second sampler for the second regulator coupled to receive the second voltage output and to provide the second sampled voltage output as feedback for the second regulator.

2. The voltage regulation system of claim 1, wherein the first sampler and the second sampler comprise capacitors and switches controlled by a clock signal to provide switched-capacitor operation.

3. The voltage regulation system of claim 2, wherein the clock signal has a variable frequency based upon the first sampled voltage output to reduce power consumption.

4. The voltage regulation system of claim 3, wherein the variable frequency is increased when the first sampled voltage output drops below the reference voltage and is decreased when the first sampled voltage output rises above the reference voltage.

5. The voltage regulation system of claim 1, wherein the integrated circuit comprises a semiconductor substrate, wherein the first load region comprises a well of a first dopant type within the semiconductor substrate, and wherein the second load region comprises a well of a second dopant type within the semiconductor substrate.

6. The voltage regulation system of claim 1, wherein the second regulator is coupled to receive the first sampled voltage output through a divider, the divider causing the second voltage output to track the first voltage output by a symmetry ratio.

7. The voltage regulation system of claim 6, wherein the divider is programmable.

8. The voltage regulation system of claim 6, wherein the divider comprises capacitors and switches controlled by a clock signal to provide switched-capacitor operation, and wherein the clock signal has a variable frequency based upon the first sampled voltage output to reduce power consumption.

9. The voltage regulation system of claim 1, wherein the first regulator comprises a first comparator having the reference voltage and the first sampled voltage output as inputs and having a first output coupled to a first charge pump, and wherein the second regulator comprises a second comparator having the first sampled voltage output and the second sampled voltage output as inputs and having a second output coupled to a second charge pump.

10. An integrated circuit, comprising:
- a first load region within a semiconductor substrate having a first dopant type;
- a second load region within the semiconductor substrate having a second dopant type;
- a voltage regulation system, comprising:
  - a first regulator having a reference voltage as an input and having a first voltage output coupled as a back-bias voltage to the first load region, the first voltage output being based upon the reference voltage and a first sampled voltage output;
  - a first sampler for the first regulator coupled to receive the first voltage output and to provide the first sampled voltage output as feedback for the first regulator;
  - a second regulator having the first sampled voltage output as an input and having a second voltage output coupled as a back-bias voltage to the second load region, the second voltage output tracking the first voltage output and being based upon the first sampled voltage output and a second sampled voltage output; and
  - a second sampler for the second regulator coupled to receive the second voltage output and to provide the second sampled voltage output as feedback for the second regulator.

11. The integrated circuit of claim 10, wherein the first sampler and the second sampler comprise capacitors and switches controlled by a clock signal to provide switched-capacitor operation.

12. The integrated circuit of claim 11, wherein the clock signal has a variable frequency based upon the first sampled voltage output to reduce power consumption.

13. The integrated circuit of claim 10, wherein the second regulator comprises a divider coupled to receive the first voltage output, the divider causing the second voltage output to track the first voltage output by a symmetry ratio.

14. The integrated circuit of claim 13, wherein the divider is programmable, wherein the divider comprises capacitors and switches controlled by a clock signal to provide switched-capacitor operation, and wherein the clock signal has a variable frequency based upon the first sampled voltage output to reduce power consumption.

15. A method, comprising
with a first regulator within an integrated circuit,
- receiving a reference voltage as an input;
- generating a first voltage output based upon the reference voltage and a first sampled voltage output;
- applying the first voltage output as a back-bias voltage to a first load region within the integrated circuit; and
- sampling the first voltage output to provide the first sampled voltage output as feedback for the first regulator; and with a second regulator within the integrated circuit,
- receiving the first sampled voltage output as an input;
- generating a second voltage output that tracks the first voltage output and that is based upon the first sampled voltage output and a second sampled voltage output;
- applying the second voltage output as a back-bias voltage to a second load region within the integrated circuit; and
- sampling the second voltage output to provide the second sampled voltage output as feedback for the second regulator.

16. The method of claim 15, wherein sampling comprises controlling switches coupled to capacitors with a clock signal to provide switched-capacitor operation.

17. The method of claim 16, further comprising varying a frequency for the clock signal based upon the first sampled voltage output to reduce power consumption.

18. The method of claim 17, wherein the varying comprises increasing the frequency when the first sampled voltage output drops below the reference voltage and decreasing the frequency when the first sampled voltage output rises above the reference voltage.

19. The method of claim 18, wherein the adjusting comprises controlling switches coupled to capacitors with a clock signal to provide switched-capacitor operation, and further comprising varying a frequency for the clock signal based upon the first sampled voltage output to reduce power consumption.

20. The method of claim 15, further comprising, with the second regulator, adjusting the first sampled voltage output by a symmetry ratio as part of the generating of the second voltage output.

* * * * *